United States Patent [19]

Henley

[11] Patent Number: 5,543,729
[45] Date of Patent: Aug. 6, 1996

[54] TESTING APPARATUS AND CONNECTOR FOR LIQUID CRYSTAL DISPLAY SUBSTRATES

[75] Inventor: Francois J. Henley, Los Gatos, Calif.

[73] Assignee: Photon Dynamics, Inc., Milpitas, Calif.

[21] Appl. No.: 758,884

[22] Filed: Sep. 10, 1991

[51] Int. Cl.⁶ .................................................. G01R 19/00
[52] U.S. Cl. .......................................... 324/770; 324/752
[58] Field of Search .......................... 324/73.1, 158 R,
324/158 F, 158 D, 96, 765, 754, 72.5, 770,
500, 537; 439/66, 86, 511, 512, 513, 507,
509; 340/796; 174/88 R, 52.1, 252; 361/751

[56] References Cited

U.S. PATENT DOCUMENTS

| | | | |
|---|---|---|---|
| 3,908,153 | 9/1975 | Cason, Jr. .................................. | 439/513 |
| 3,992,663 | 11/1976 | Seddick ....................................... | 324/52 |
| 3,998,513 | 12/1976 | Kobayashi et al. ......................... | 439/86 |
| 4,019,094 | 4/1977 | Dinger et al. .............................. | 439/511 |
| 4,065,717 | 12/1977 | Kattner et al. ............................ | 324/754 |
| 4,242,635 | 12/1980 | Burns ....................................... | 324/158 |
| 4,355,278 | 10/1982 | Burns et al. .............................. | 324/158 |
| 4,368,523 | 1/1983 | Kawate ..................................... | 365/63 |
| 4,444,801 | 4/1984 | Hongo et al. ............................. | 427/10 |
| 4,463,073 | 7/1984 | Miyauchi et al. ......................... | 430/5 |
| 4,465,969 | 8/1984 | Tada et al. ............................... | 324/96 |
| 4,507,605 | 3/1985 | Geisel ....................................... | 324/73 |
| 4,510,222 | 4/1985 | Okunaka et al. ......................... | 430/5 |
| 4,523,847 | 6/1985 | Bjorklund et al. ........................ | 356/349 |
| 4,542,333 | 9/1985 | Koontz ...................................... | 324/52 |
| 4,563,093 | 1/1986 | Tada et al. ............................... | 356/368 |
| 4,618,819 | 10/1986 | Mourou et al. ........................... | 324/77 |
| 4,631,576 | 12/1986 | St. John .................................... | 358/65 |
| 4,633,242 | 12/1986 | Sekiya ....................................... | 340/719 |
| 4,636,403 | 1/1987 | Fisanick et al. .......................... | 427/53 |
| 4,688,900 | 8/1987 | Doane et al. ............................. | 350/347 |
| 4,727,234 | 2/1988 | Oprysko et al. .......................... | 219/121 |
| 4,729,166 | 3/1988 | Lee et al. .................................. | 29/877 |
| 4,758,092 | 7/1988 | Heinrich et al. .......................... | 356/36 |
| 4,776,022 | 10/1988 | Fox et al. .................................. | 382/8 |
| 4,819,038 | 4/1989 | Alt ............................................ | 357/4 |
| 4,825,201 | 8/1989 | Watanabe et al. ........................ | 340/717 |
| 4,855,591 | 8/1989 | Nakamura et al. ....................... | 250/225 |
| 4,862,075 | 8/1989 | Choi et al. ................................ | 324/158 |
| 4,868,492 | 11/1989 | Beha et al. ............................... | 324/73 |
| 4,875,006 | 10/1989 | Henley et al. ............................ | 324/158 |
| 4,899,105 | 2/1990 | Akiyama ................................... | 324/158 |
| 4,906,922 | 3/1990 | Takahashi et al. ....................... | 324/158 |
| 4,910,458 | 3/1990 | Forsyth et al. ........................... | 324/158 |
| 4,927,368 | 5/1990 | Shino ........................................ | 439/66 |
| 4,943,768 | 7/1990 | Niki et al. ................................. | 324/754 |
| 4,944,576 | 7/1990 | Lacker et al. ............................ | 350/334 |
| 4,983,911 | 1/1991 | Henley ...................................... | 324/158 |
| 4,999,577 | 3/1991 | Beha et al. ............................... | 324/158 |
| 5,017,755 | 5/1991 | Yahagi et al. ............................ | 219/121 |
| 5,037,683 | 7/1991 | Takahashi et al. ....................... | 324/158 |
| 5,043,297 | 8/1991 | Suzuki et al. ............................. | 437/51 |
| 5,113,134 | 5/1992 | Plus et al. ................................ | 324/770 |
| 5,116,241 | 5/1992 | Sato .......................................... | 439/511 |

FOREIGN PATENT DOCUMENTS

| | | |
|---|---|---|
| 3111393A1 | 9/1982 | Germany . |
| 56-154678 | 11/1981 | Japan . |
| 56-153262 | 11/1981 | Japan . |

OTHER PUBLICATIONS

System Tests Devices At GHz Rates, Lyle H. McCarty, Design News, Apr. 10, 1989.

Electro-Optic Device Tester Tops 1 GHz, John Novellino, Electronic Design, Sep. 8, 1988.

An Ultra High Speed Test System, Francois J. Henley, IEEE Design & Test of Computers, Feb. 1989.

(List continued on next page.)

*Primary Examiner*—Vinh P. Nguyen
*Attorney, Agent, or Firm*—Townsend and Townsend and Crew, LLP

[57] ABSTRACT

An elastic member is wrapped with wire or a wire mesh to provide uniform electrical contact with a substrate. The elastic member is compressible, allowing pressure to be applied, and a firmer contact established without damaging the contact points on the substrate.

19 Claims, 3 Drawing Sheets

OTHER PUBLICATIONS

** Electro–Optic Technology Supports Gigahertz Speeds; Francois J. Henley, Electronics Test, Sep. 1988.

** Using Electro–Optic Sampling Technology For Accurate Gigahertz ATE: Overview of the Art, Francois J. Henley, 1990 IEEE VLSI Test Symposium (no month available).

High Speed Pattern Generator and GaAs Pin Electronics for a Gigahertz Production Test System, D. J. Kratzer, S. Barton, F. J. Henley D. A. Plomgren, Proceedings of IEEE 1988 Int'l Test Conf, Sep. 1988.

Test Head Using Electro–Optic Receivers and GaAs Pin Eloectronics for a Gigahertz Production Test System, F. J. Henley, H. J. Choi, Proceedings of IEEE 1988 Int'l Test Conference, Sep. 1988.

Achieving ATE Accuracy at Gigahertz Test Rates: Comparison of Electronic and Electro–Optic Sampling Technologies, F. J. Henley, H. J. Choi, Int'l Test Conf. Aug., 1989.

Systems Solutions Based on Electro–Optic Sampling to High Speed IC Test Problems, F. J. Henley, D. B. Mac Donald, SPIE vol. 795 Characterization of Very High Speed Semiconductor Devices & Integrated Circuits (1987) pp. 345–351 (no month available).

Characterization of High Seed (Above 500 MHz) Devices Using Advanced ATE-Techniques, Results and Device Problems, S. Barton, Proceedings of the IEEE 1989, Int'l Test Conf., Aug. 1989.

Measurement of Electro–Optic Characteristics of LCDs; M. E. Becker et al.; SID 90 Digest; pp. 163–166; 1990 (no month available).

Testing and Qualificastions of a Si TFT–LC Color Cells for Military Avionics Applications: F. C. Luo et al; SID 90 Digest; pp. 194–196; 1990 (no month available).

In–Process Testing of Thin Film Transistor Arrays; R. Wisnieff et al.; SID 90 Digest pp. 190–193 (no month available).

NCAP Displays: Optical Switching and Dielectric Properties; L. Welsh et al.; SID 90 Digest; pp. 220–223 (no month available).

TESTING APPARATUS AND CONNECTOR FOR LIQUID CRYSTAL DISPLAY SUBSTRATES

FIELD OF THE INVENTION

The present invention relates to an apparatus and method for electrically connecting extremely small contacts with external circuitry.

BACKGROUND OF THE INVENTION

The present invention relates to a testing apparatus for the purpose of testing for defects in liquid crystal display substrates used in liquid crystal display panels and the like.

The so-called active matrix system has been used in the realization of liquid crystal display panels having a high number of pixels which are used in liquid crystal televisions, or the like. These have a construction which is provided with switching circuits which operate by means of the thin film transistors of the various pixels; the number of pixels generally reaches 250,000 to 500,000, and units with more than 1,000,000 have reached the marketplace.

Conventionally, in the manufacturing of liquid crystal display panels of this type of active matrix type, a process has been used in which pixel electrodes corresponding to each pixel are formed in a matrix on a substrate of glass or the like, gate lines and source lines are connected to each of these pixel electrodes. Thin film transistors are then formed, corresponding to each of the pixel electrodes. An active matrix liquid crystal display substrate (hereinafter "liquid crystal substrate") is thus manufactured. A transparent substrate is then disposed above this liquid crystal substrate and facing it, separated by a small space, and the space filled with liquid crystal.

SUMMARY OF THE INVENTION

Liquid crystal substrates contain a plurality of pixel electrodes and leads corresponding thereto, as well as thin film transistors. Liquid crystal substrates are manufactured in clean rooms which are controlled so as to contain an extremely small amount of dust. In liquid crystal substrates with a large number of pixels, the size of each pixel and the widths of the leads are extremely small, so that the presence of a small amount of microdust in the manufacturing atmosphere is directly connected to open circuit defects or short circuit defects of the gate lines or the source lines. A level of up to 10 defects is permitted with respect to each liquid crystal substrate. Liquid crystal substrates having high numbers of pixels are manufactured with the current manufacturing technology, making it extremely difficult to keep the number of defects below the permitted limit, and the rate of unacceptable units is strikingly high.

In the manufacture of liquid crystal substrates, it is necessary to test for defects. Conventionally, there was no testing of defects in liquid crystal substrates themselves, and, as a result, only after the completion of the liquid crystal display panel was a test conducted by observing whether each pixel actually functioned or not. Even if defects were detected at this point, it was difficult to repair the liquid crystal substrates and the products had to be rejected and disposed of. This was one factor which prevented improvement in the yield of active matrix type liquid crystal display panels.

It is an object of the present invention to provide an effective apparatus which can test for defects in the liquid crystal substrates used in liquid crystal display panels, and the like, themselves.

An apparatus for detecting defects in liquid crystal display substrates comprises an electro-optical element, the optical properties of which change when an electric field is impressed thereon, which is disposed facing a liquid crystal substrate with a very small gap therebetween. A voltage is applied across the electro-optical element, light irradiated onto surface of the electro-optical element, and the reflected light observed. The voltage is applied across the electro-optical element by connecting a voltage source to a member which is in contact with the surface of the liquid crystal display substrate, and is in direct or intermediate contact with source lines or gate lines, and a transparent electrode on the surface of the electro-optical element.

The optical properties of the electro-optical element change when an electric field is impressed across it. The electro-optical element is disposed facing the liquid crystal substrate to be tested with a small gap therebetween. When an electric voltage is applied between the pixel electrodes on the liquid crystal substrate and the electro-optical element, an electric field is generated, causing the optical properties of the electro-optical element to change. By irradiating the electro-optical element from a light source, receiving the reflected light, and observing the reflected light, it is possible to detect a change in the optical properties of the electro-optical element. In this way, the presence or the status of defects in the liquid crystal substrate can be determined.

The electrical connection in the apparatus of the present invention provides superior attachment to, and detachment from, the liquid crystal display substrate at the time of testing, is relatively easy and guarantees sufficient contact area and contact pressure.

DESCRIPTION OF A PREFERRED EMBODIMENT

Figure 4:
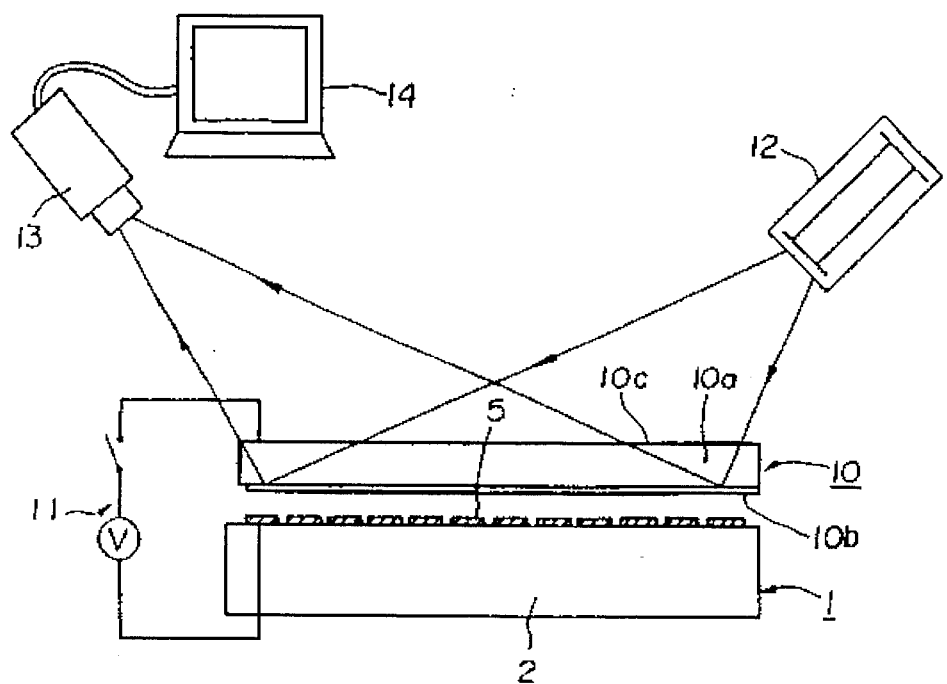
FIG. 4 shows the basic construction and operational principle of the testing apparatus.
Figure 5:
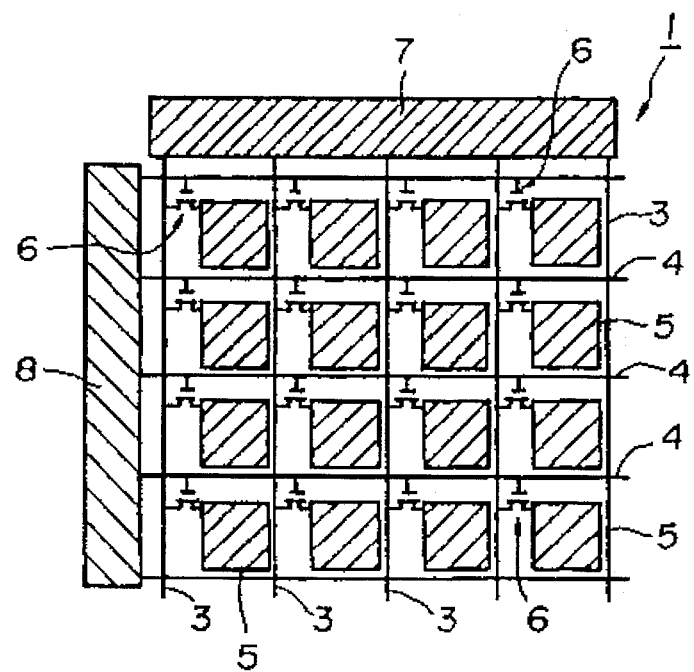
FIG. 5 shows an example of a liquid crystal substrate, which is the object of testing.

Hereinafter, the preferred embodiments of the present invention will be explained with reference to the diagrams. First, the liquid crystal substrate which is the object of testing shown in FIG. 5 will be explained. A liquid crystal substrate 1 is commonly known and is used in liquid crystal display panels and the like. It is constructed by forming a plurality of source lines 3 for the purpose of transmitting data signals, and a plurality of gate lines 4 for the purpose of transmitting scanning signals, in an aligned state on the surface of a substrate 2 which is glass or the like. Pixel electrodes 5 are formed between these source lines 3 and gate lines 4. Pixel electrodes 5 are connected to source lines 3 and gate lines 4 through thin film transistors 6, which are used as switching elements. Reference number 7 indicates a shorting bar which is connected to source lines 3. Reference number 8 indicates a shorting bar which is connected to gate lines 4. Shorting bars 7 and 8 are used to prevent static electricity from causing deleterious effects on thin film transistor 6, and also connect a voltage source to pixel electrodes 5 through the source lines 3 and gate lines 4 during testing. Shorting bars 7 and 8 are removed when the liquid crystal substrate 1 is completed. Shorting bars 7 and 8 may be omitted, and a voltage is directly impressed onto source lines 3 and gate lines 4 during testing. The testing apparatus of the present preferred embodiment tests for defects in the liquid crystal substrate 1 as explained herein. It tests for open circuit defects or short circuits in source lines 3, gate lines 4 or pixel electrodes 5. First, the basic construction and operational principle will be explained by FIG. 4. In FIG. 4, reference number 10 indicates an electro-optical element which is approximately the same size as the liquid crystal substrate 1 to be tested. The electro-optical element is disposed facing the front surface side of the liquid crystal substrate 1 with a small gap on the level of 10's of microns therebetween. Reference number 11 indicates a power source which is used to impress a voltage between the electro-optical element 10 and the pixel electrodes 5 of the liquid crystal substrate 1. Reference number 12 indicates a light source which radiates light onto the back surface (in FIG. 4, the upper surface) of electro-optical element 10. Reference number 13 indicates a light detector which receives the reflected light from electro-optical element 10. Reference number 14 indicates a monitor for observing the picture seen by light detector 13.

Figure 3:
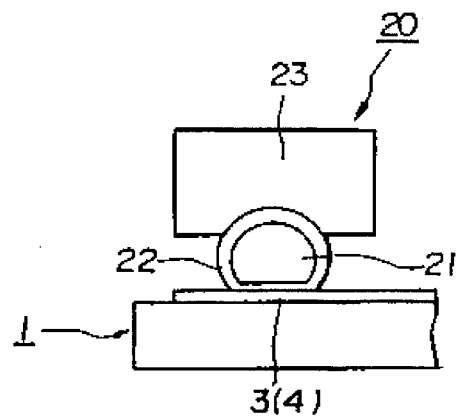
FIG. 3 is a side view of the same contactor.

The electro-optical element 10 uses a liquid crystal sheet or Pockels crystal plate, or the like, the optical properties of which change when an electric field is impressed thereon. As shown in FIG. 3, a light reflecting body 10b, such as a dielectric multi-layer material, or the like, is formed on or attached to the bottom surface of a liquid crystal sheet 10a. Liquid crystal sheet 10a consists of a transparent case, the interior of which is filled with liquid crystal, and on the upper surface of which a thin-layer transparent electrode 10c is formed. The light-transmission rate of liquid crystal sheet 10a changes as a result of the size of the electric field generated within liquid crystal sheet 10a.

Liquid crystal material such as NCAP (Nematic Curvilinear Aligned Phase) material, or the like is acceptable. Liquid crystals material in which drop-shaped liquid crystals are dispersed in a high molecular substance are preferred, such as a polymer.

The orientation of the spheres (droplets of the high molecular substance) which are contained in the liquid crystal are controlled by the state of the electric field, a transparent state or a nontransparent state is caused to appear by means of the agreement or nonagreement of the index of refraction of the high molecular substance and the liquid crystal. As another example of electro-optical element 10, it is possible to use a Pockels crystal in which the amount of polarization of the reflected light changes based on the size of the electric field applied. As long as the optical properties such as the transmission rate of light, or the amount of polarization of the reflected light change by a fixed proportion when an electric field is impressed thereon, then the electro-optical element is not limited to the above, and other electro-optical elements may be used.

Power source 11 is electrically connected to the thin film transparent electrode 10c of electro-optical element 10 and shorting bars 7, 8 (see FIG. 4) of liquid crystal substrate 1. When shorting bars 7 and 8 are omitted, connection is made to source lines 3 and gate lines 4, and impresses a voltage on all pixel electrodes 5 on liquid crystal substrate 1 through source lines 3 and gate lines 4. A power source 11 is preferred which can impress a voltage pulse separately on source lines 3 and gate lines 4, and can change the pulse voltage, pulse width, and duty cycle. A halogen lamp is acceptable as light source 12, however, it is also acceptable to use any type of laser light. It is acceptable to use a CCD camera, or the like, as light detector 13.

When a voltage is applied between liquid crystal substrate 1 and electro-optical element 10 by power source 11, the electric field generated by each pixel electrode 5 changes in response to the presence of defects. The reflected light which was radiated onto electro-optical element 10 is received by light detector 13 and the condition and magnitude of this reflected light is observed in monitor 14. By analysis of this image data by an image processing technique, it is possible to determine the change in the optical properties of electro-optical element 10. Based oh this, the presence of and type of defects in liquid crystal substrate 1 can be ascertained.

For example, when open-circuit defects occur in pixel electrodes 5, gate lines 3, source lines 4 or other parts on liquid crystal substrate 1, even if a voltage is supplied by power source 11, a part of pixel electrode 5 does not function, and as a result, the optical properties of the electro-optical element 10 above the pixel electrode 5 which do not function do not change. When there is a short circuit defect, operation of electro-optical element 10 is caused by the application of an electric voltage to one or the other of source lines 3 or gate lines 5, and by detecting this, it is known that short circuit defects have occurred.

In order to conduct the above type of testing, it is necessary to detachably connect power source 11 to liquid crystal substrate 1, so contactors are provided for this purpose in the testing apparatus. Hereinafter, contactors 20 will be explained with reference to FIGS. 1 through 3.

Figure 1:
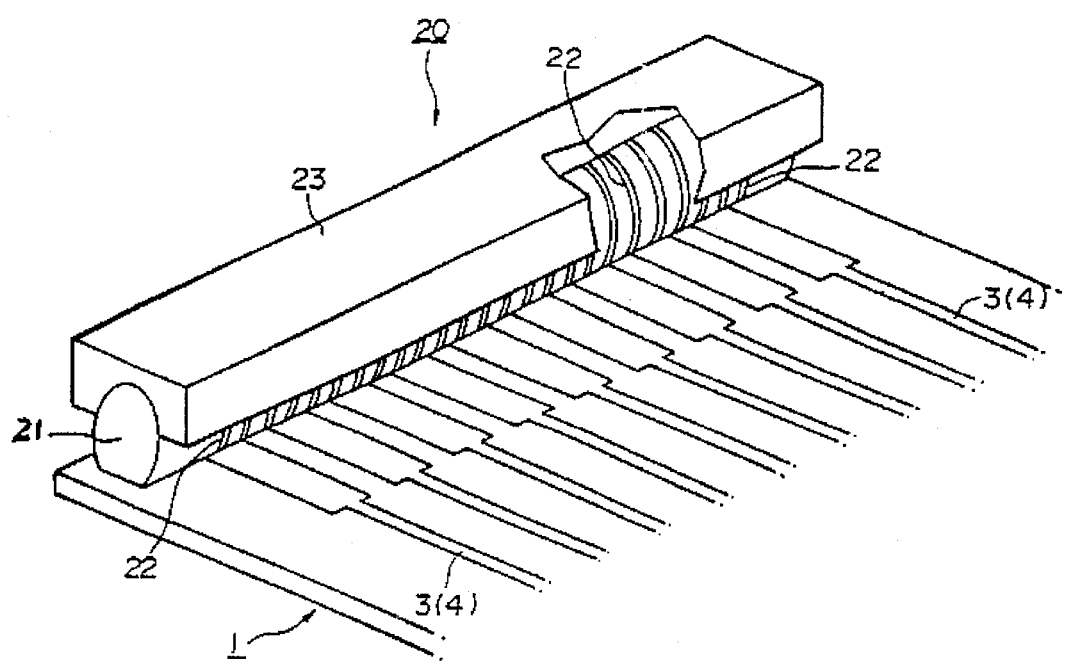
FIG. 1 is a perspective view of a contactor in a preferred embodiment of the present invention.
Figure 2:
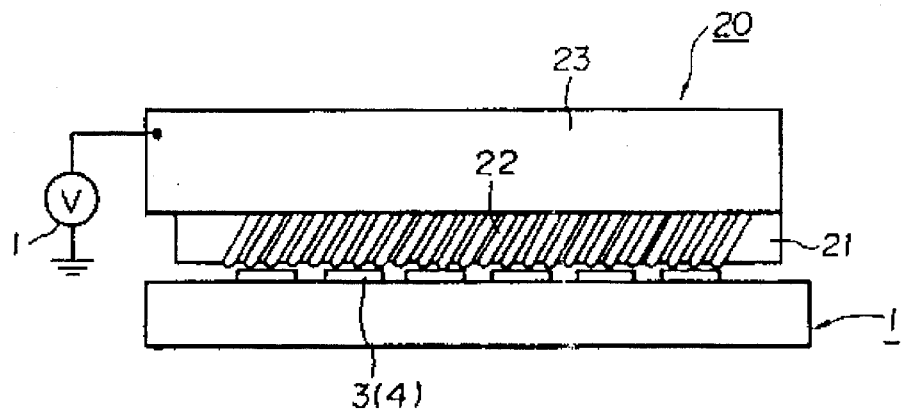
FIG. 2 is a front view of the same contactor.

Contactors 20, on the surface of elastic member 21 (which is round in cross section), has a rod shape, and comprise materials having flexibility, such as rubber, resin, or the like. A wire 22 comprising a metal having good conductivity such as gold is wrapped tightly around elastic member 21 over almost the entire surface thereof as a deformable electrode. By maintaining this elastic member 21 on the lower surface side of support member 23 (comprising conductive metal), support member 23 and the above wire 22 are in contact. Support member 23 is in electrical contact with power source 11. As shown in FIGS. 1 to 3, contactor 20, elastic member 21 and the wire 22 provided on the surface thereof are placed in urging contact with the ends of source lines 3 and gate lines 4. In this way, power source 11 and pixel electrodes 15 are placed in electric contact through support member 23, wire 22, source lines 3 and gate lines 4. When shorting bars 7 and 8 are provided, elastic member 21 and wire 22 are placed in urging contact with shorting bars 7 and 8.

By means of contactor 20, by the urging contact of elastic member 21 with respect to the liquid crystal substrate 1, the wire 22 and the source lines 3 and gate lines 4 (or shorting bars 7 and 8) are placed in "wire" and "surface" contact, and sufficient contact area is guaranteed. By the elastic deformation force of elastic member 21, sufficient contact pressure is also guaranteed. Accordingly, it is possible to make the contact resistance sufficiently small, and thus to obtain an ideal electric contact state. Even if elastic member 21 is placed into urging contact with liquid crystal substrate 1 by means of the elastic deformation thereof, no damage is done to leads 3 or 4, or to shorting bars 7 and 8. Moreover, in connector 20, there is a construction in which wire 22 is closely wrapped about nearly the entire length of elastic member 21 so that the electric potential becomes uniform in the lengthwise direction of contactor 20. Accordingly, the voltage impressed on each lead 3 and 4 is equal, and it is possible to ensure the accuracy of testing. Of course, solely by the urging contact of this contactor 20 with respect to a liquid crystal substrate 1, an electric contact is achieved so that it is possible to conduct the attachment to and detachment from a liquid crystal substrate 1 at the time of testing in an extremely easy manner and in a short period of time.

In the above preferred embodiment, wire 22 was used as the deformable electrode and was wound directly around elastic member 21. It is also permissible to use a wire 22 in mesh form, and wrap it around elastic member 21. It is possible to use a conductive metal layer or conductive metal leaf in place of wire 22 and to form or attach the same to the surface of elastic member 21 as an electrode. Furthermore, the round cross sectional shape of elastic member 21 was chosen, however, it is acceptable to have a rectangular cross section, triangular cross section, or other shaped contact, and to place this in urging contact with liquid crystal substrate 1, and increase the contact pressure between the electrodes and the shorting bar or leads.

What is claimed:

1. An apparatus for detecting defects in a liquid crystal display substrate, the liquid crystal display substrate having a circuit side including a plurality of pixel electrodes, a plurality of corresponding source lines, and a plurality of corresponding gate lines, the apparatus comprising:

an electro-optical element having optical properties that change when an electric field is impressed thereon, said electro-optical element including a front surface and a back surface, said front surface disposed facing the circuit side of the liquid crystal display substrate with a very small gap therebetween;

a power source for impressing a voltage between said electro-optical element and each of the plurality of pixel electrodes on the liquid crystal display substrate;

a light source for irradiating said back surface of said electro-optical element;

a light detector for receiving reflected light from said back surface of said electro-optical element; and a contact coupled to said power source and removably couplable to the liquid crystal display substrate, for electrically coupling said power source to each of the plurality of pixel electrodes through the plurality of corresponding gate lines and the plurality of corresponding source lines, said contact comprising:

a bar-shaped elastic member removably couplable to the circuit side of the liquid crystal display substrate;

a flexible electrode disposed on said bar-shaped elastic member, electrically coupled to said power source and removably electrically couplable to the plurality of corresponding source lines and to the plurality of corresponding gate lines; and a support member coupled to said bar-shaped elastic member and to said flexible electrode, for removably coupling said bar-shaped elastic member to the circuit side of the liquid crystal display substrate, and for removably electrically coupling said flexible electrode to the plurality of corresponding source lines and to the plurality of corresponding gate lines.

2. An apparatus for electrically contacting a plurality of parallel contacts comprising:

an elastic member couplable to the plurality of parallel contacts, said elastic member arbitrarily-positioned in a transverse direction to the plurality of parallel contacts;

a deformable electrode substantially covering said elastic member, couplable to the plurality of parallel contacts; and wherein said deformable electrode and said elastic member are compressed against the plurality of parallel contacts to couple said elastic member and said deformable electrode to the plurality of parallel contacts.

3. The apparatus as described in claim 2:

wherein said elastic member further comprises a body having a relatively long side and a relatively short side; and wherein said relatively long side of said body is arbitrarily-positioned in a transverse direction to the plurality of parallel contacts.

4. The apparatus as described in claim 3 wherein said elastic member has a cross-section having an ellipsoid shape.

5. The apparatus as described in claim 3 wherein said relatively long side of said elastic member has a length substantially exceeding a width and a height of a cross-section of said elastic member.

6. The apparatus as described in claim 2 wherein said deformable electrode comprises wire.

7. The apparatus as described in claim 6 wherein said wire comprises a wire mesh.

8. The apparatus as described in claim 2 wherein said deformable electrode covers said elastic member in a manner such that an electrical potential applied to said deformable electrode remains substantially uniform throughout said deformable electrode.

9. The apparatus as described in claim 2 wherein electrical contact is made between said deformable electrodes and the plurality of parallel contacts by means of compressive deformation of said elastic member.

10. The apparatus as described in claim 9 wherein electrical resistance between an arbitrary first point on said deformable electrode, and an arbitrary second point on said deformable electrode is substantially zero.

11. An connection apparatus for electrically connecting a liquid crystal display base plate having a plurality of electrical lines to a contact of a test apparatus, the connection apparatus comprising:

an elastic member removably couplable to the plurality of electrical lines, said elastic member arbitrarily-positioned in a transverse direction to the plurality of electrical lines;

a deformable electrode substantially covering said elastic member in a manner such that a voltage applied to said deformable electrode is relatively uniform throughout said deformable electrode, said deformable electrode coupled to the contact and removably couplable to the plurality of electrical lines; and wherein said elastic member and said deformable electrode are compressed against the liquid crystal display base plate to couple said elastic member and said deformable electrode to the plurality of electrical lines.

12. The connection apparatus as described in claim 11 wherein said elastic member has a cross-section having a polygonal shape.

13. The connection apparatus as described in claim 11:

wherein said elastic member has a length substantially exceeding a width and a height of a cross-section of said elastic member.

14. The connection apparatus as described in claim 11 wherein said deformable electrode comprises wire.

15. The connection apparatus as described in claim 11 wherein said deformable electrode comprises a wire mesh.

16. The connection apparatus as described in claim 11 wherein electrical contact is made between the contact and the plurality of electrical lines by means of compressive deformation of said elastic member.

17. An apparatus for detecting defects in a liquid crystal display substrate, the liquid crystal display substrate having a circuit side including a plurality of pixel electrodes, a plurality of corresponding source lines, and a plurality of corresponding gate lines, the apparatus comprising:

an electro-optical element having optical properties that change when an electric field is impressed thereon, said electro-optical element including a front surface and a back surface, said front surface disposed facing the circuit side of the liquid crystal display substrate with a very small gap therebetween;

a power source for impressing a voltage between said electro-optical element and each of the plurality of pixel electrodes on the liquid crystal display substrate;

a light source for irradiating said back surface of said electro-optical element;

a light detector for receiving reflected light from said back surface of said electro-optical element; and a contact coupled to said power source and removably couplable to the liquid crystal display substrate, for electrically coupling said power source to each of the plurality of pixel electrodes through the plurality of corresponding source lines, said contact comprising:

a bar-shaped elastic member removably couplable to the circuit side of the liquid crystal display substrate;

a flexible electrode disposed on said bar-shaped elastic member, electrically coupled to said power source and removably electrically couplable to the plurality of corresponding source lines; and a support member coupled to said bar-shaped elastic member and to said flexible electrode, for removably coupling said bar-shaped elastic member to the circuit side of the liquid crystal display substrate, and for removably electrically coupling said flexible electrode to the plurality of corresponding source lines.

18. An apparatus for electrically coupling a contact to a liquid crystal display substrate, the liquid crystal display substrate including a plurality of pixel electrodes having a plurality of corresponding parallel source lines and a plurality of corresponding parallel gate lines, the apparatus comprising:

a bar-shaped elastic member removably couplable to the plurality of corresponding parallel source lines, said bar-shaped elastic member arbitrarily-positioned in a direction transverse to the plurality of corresponding parallel source lines;

a flexible electrode disposed on and substantially covering said bar-shaped elastic member, electrically coupled to the contact and removably electrically couplable to the plurality of corresponding parallel source lines; and a support member coupled to said bar-shaped elastic member, for removably coupling said bar-shaped elastic member and said flexible electrode to the plurality of corresponding source lines.

19. The apparatus as described in claim 18:

wherein said flexible electrode is also removably electrically couplable to the plurality of corresponding parallel gate lines; and wherein said support member is also for removably electrically coupling said bar-shaped elastic member and said flexible electrode to the plurality of corresponding gate lines.

* * * * *